US012581886B2

(12) United States Patent
Kinoshita

(10) Patent No.: US 12,581,886 B2
(45) **Date of Patent: *Mar. 17, 2026**

(54) PROTECTIVE FILM FORMING AGENT, AND METHOD FOR PRODUCING SEMICONDUCTOR CHIP

(71) Applicant: TOKYO OHKA KOGYO CO., LTD., Kawasaki (JP)

(72) Inventor: Tetsuro Kinoshita, Kawasaki (JP)

(73) Assignee: TOKYO OHKA KOGYO CO., LTD., Kawasaki (JP)

( * ) Notice: Subject to any disclaimer, the term of this patent is extended or adjusted under 35 U.S.C. 154(b) by 450 days.

This patent is subject to a terminal disclaimer.

(21) Appl. No.: 17/756,790

(22) PCT Filed: Nov. 26, 2020

(86) PCT No.: PCT/JP2020/043941

§ 371 (c)(1),
(2) Date: Jun. 2, 2022

(87) PCT Pub. No.: WO2021/131472

PCT Pub. Date: Jul. 1, 2021

(65) Prior Publication Data

US 2022/0392806 A1 Dec. 8, 2022

(30) Foreign Application Priority Data

Dec. 24, 2019 (JP) ................................ 2019-233126

(51) Int. Cl.

*H01L 21/78* (2006.01)
*H01L 23/29* (2006.01)
(Continued)

(52) U.S. Cl.

CPC ............ *H01L 21/78* (2013.01); *H01L 23/293* (2013.01); *H01L 21/268* (2013.01);
(Continued)

(58) Field of Classification Search

CPC ............... H01L 21/78; H01L 21/31127; H01L 23/3192; H01L 23/293; H01L 21/268; H01L 21/3065; H01L 21/31105
See application file for complete search history.

(56) References Cited

U.S. PATENT DOCUMENTS 11,407,063 B2 * 8/2022 Kinoshita ........... H01L 21/6836
11,648,742 B2 5/2023 Tokarski
(Continued)

FOREIGN PATENT DOCUMENTS

CN 1800258 A 7/2006
CN 105489472 A 4/2016
(Continued)

OTHER PUBLICATIONS

Notification of Reasons for Refusal in Japanese Patent Application No. 2020-556641, dated Jun. 8, 2021 (2 pages).
(Continued)

*Primary Examiner* — John E Uselding
(74) *Attorney, Agent, or Firm* — Knobbe, Martens, Olson & Bear, LLP

(57) ABSTRACT

A protective film forming agent that, in dicing of a semiconductor wafer, is used to form a protective film on the surface of the semiconductor wafer, can form a protective film that has excellent laser processability, and has excellent solubility of a light-absorbing agent; and a method for producing a semiconductor chip using the protective film forming agent. The protective film forming agent includes a water-soluble resin, a light-absorbing agent, a basic compound, and a solvent. The basic compound is an alkylamine, an alkanolamine, an imidazole compound, ammonia, or an alkali metal hydroxide. The light-absorbing agent content of the protective film forming agent is 0.1-10 mass % (inclusive).

5 Claims, 5 Drawing Sheets

(51) Int. Cl.

| | |
|---|---|
| *H01L 21/268* | (2006.01) |
| *H01L 21/3065* | (2006.01) |
| *H01L 21/311* | (2006.01) |
| *H01L 23/31* | (2006.01) |

(52) U.S. Cl.
CPC ..... *H01L 21/3065* (2013.01); *H01L 21/31105* (2013.01); *H01L 21/31127* (2013.01); *H01L 23/3192* (2013.01)

(56) References Cited

U.S. PATENT DOCUMENTS

| | | | | |
|---|---|---|---|---|
| 11,929,284 | B2 * | 3/2024 | Kinoshita | C09D 177/06 |
| 2006/0105544 | A1 | 5/2006 | Takanashi et al. | |
| 2010/0284072 | A1 * | 11/2010 | Saitou | G02B 1/04 428/41.5 |
| 2010/0304551 | A1 * | 12/2010 | Takanashi | C09D 5/32 257/E21.599 |
| 2011/0245367 | A1 | 10/2011 | Kurdyumov et al. | |
| 2012/0322233 | A1 | 12/2012 | Lei et al. | |
| 2014/0151328 | A1 | 6/2014 | Miyanari et al. | |
| 2015/0179538 | A1 | 6/2015 | Shinjo et al. | |
| 2016/0291475 | A1 | 10/2016 | Uematsu et al. | |
| 2017/0121562 | A1 | 5/2017 | Wang et al. | |
| 2018/0012787 | A1 | 1/2018 | Oka et al. | |
| 2018/0114696 | A1 | 4/2018 | Norimoto | |
| 2018/0158691 | A1 | 6/2018 | Yokoi et al. | |
| 2019/0006295 | A1 * | 1/2019 | Tadano | H01L 21/78 |
| 2019/0157100 | A1 | 5/2019 | Harikai et al. | |
| 2019/0371668 | A1 | 12/2019 | Karasaki et al. | |
| 2019/0371669 | A1 | 12/2019 | Karasaki et al. | |
| 2022/0020643 | A1 | 1/2022 | Kinoshita et al. | |
| 2022/0392805 | A1 | 12/2022 | Ryo et al. | |
| 2023/0091496 | A1 | 3/2023 | Osawa et al. | |

FOREIGN PATENT DOCUMENTS

| | | | |
|---|---|---|---|
| CN | 107210204 | A | 9/2017 |
| CN | 109216228 | A | 1/2019 |
| JP | 2005-189527 | A | 7/2005 |
| JP | 2005-266663 | A | 9/2005 |
| JP | 2008-241753 | A | 10/2008 |
| JP | 2006-140311 | A | 6/2011 |
| JP | 2011-143615 | A | 7/2011 |
| JP | 2014-049761 | A | 3/2014 |
| JP | 2016-066768 | A | 4/2016 |
| JP | 2016-191813 | A | 11/2016 |
| JP | UP 2017-042786 | A | 3/2017 |
| JP | 2018-060994 | A | 4/2018 |
| JP | 2018-129365 | A | 8/2018 |
| JP | 2014-523112 | A | 9/2018 |
| JP | 2018-174310 | A | 11/2018 |
| JP | 2019-012807 | A | 1/2019 |
| JP | 2019-518328 | A | 6/2019 |
| JP | 2019-212764 | A | 12/2019 |
| JP | 2019-212765 | A | 12/2019 |
| JP | 2020-066665 | A | 4/2020 |
| JP | 2020-066666 | A | 4/2020 |
| JP | 2020-066667 | A | 4/2020 |
| KR | 10-2016-0117276 | A | 10/2016 |
| KR | 10-2018-0111677 | A | 10/2018 |
| TW | 200631086 | A | 9/2006 |
| TW | 201614017 | A | 4/2016 |
| TW | 201704868 | A | 2/2017 |
| TW | 201906940 | A | 2/2019 |
| WO | WO 2012/173768 | A2 | 12/2012 |
| WO | WO 2017/196549 | A1 | 11/2017 |
| WO | WO 2018/217481 | A1 | 11/2018 |
| WO | WO 2020/100403 | A1 | 5/2020 |

OTHER PUBLICATIONS

Office Action dated Jun. 13, 2023 in U.S. Appl. No. 17/309,124 (12 pages).

* cited by examiner

PROTECTIVE FILM FORMING AGENT, AND METHOD FOR PRODUCING SEMICONDUCTOR CHIP

CROSS-REFERENCE TO RELATED APPLICATIONS

This application is the U.S. National Phase under 35 U.S.C. § 371 of International Application PCT/JP2020/043941, filed Nov. 26, 2020, designating the U.S., and published in Japanese as WO 2021/131472 on Jul. 1, 2021 which claims priority to Japanese Patent Application Nos. 2019-2133126 filed Dec. 24, 2019, the entire content of which is incorporated herein by reference.

TECHNICAL FIELD

The present invention relates to a protective film forming agent and a method for producing a semiconductor chip using this protective film forming agent.

BACKGROUND ART

A wafer formed in a semiconductor device manufacturing step has a laminate in which an insulating film and functional film are laminated on the surface of a semiconductor substrate such as silicon, and is demarcated by a lattice of scheduled division lines called streets, and the respective regions demarcated by the streets define semiconductor chips such as IC and LSI.

A plurality of semiconductor chips are obtained by cutting the wafer along these streets. In addition, an optical device wafer has a laminate in which a gallium nitride-based compound semiconductor or the like is laminated, and is demarcated into a plurality of regions by the streets. By cutting along these streets, the optical device wafer is divided into optical devices such as light emitting diodes or laser diodes. These optical devices are widely applied to electrical equipment.

Such cutting along the streets of a wafer has been carried out in the past by a cutting device called a dicer. However, since a wafer having a laminate structure is a highly brittle material, this method has had a problem in that at the time of cutting to divide the wafer into semiconductor chips or the like by a cutting blade (cutting edge), e.g. scratches or chipping occurs, causing the insulating film required as a circuit element formed on the chip surface to peel.

In order to avoid such flaws, the following method has been proposed in which a mask containing a layer of water-soluble material is formed on the surface of a semiconductor substrate, and next, the mask is irradiated with a laser to decompose and remove a part of the mask, whereby the surface of the semiconductor substrate is exposed at parts of the mask, and subsequently, the semiconductor substrate exposed from the parts of the mask is cut by plasma etching to divide the semiconductor substrate into semiconductor chips (IC) (see Patent Document 1).

Patent Document 1: Japanese Unexamined Patent Application (Translation of PCT Application), Publication No. 2014-523112

DISCLOSURE OF THE INVENTION

Problems to be Solved by the Invention

In the case of forming a protective film as a mask in the method described in Patent Document 1 or the like, a light-absorbing agent such as a water-soluble ultraviolet absorbing agent is often used together with a water-soluble resin. The protective film as a mask is required to have properties of decomposition and removal by lasers, i.e. laser processability. Laser processability can be made better by using a light-absorbing agent. In recent years, furthermore, since the thickness of the protective film tends to be thicker than that of conventional films, there have been increasingly cases where, in order to raise the laser processability, the amount of light-absorbing agent added in a protective film forming agent is required to be increased. When a large amount of light-absorbing agent is added to a protective film forming agent, there is a problem in that an absorbing agent is not easily dissolved in a solvent.

The present invention has been made in view of the above problems, and an object thereof is to provide a protective film forming agent that, in dicing of a semiconductor wafer, is used to form a protective film on the surface of the semiconductor wafer, can form a protective film that has excellent laser processability, and has excellent solubility of a light-absorbing agent; and a method for producing a semiconductor chip using the protective film forming agent.

Means for Solving the Problems

The present inventors have found that the above problems can be solved by mixing a basic compound (C) in a protective film forming agent including a water-soluble resin (A), a light-absorbing agent (B), and a solvent (S), thereby completing the present invention. More specifically, the present invention provides the following.

A first aspect of the present invention relates to a protective film forming agent for forming a protective film on a surface of a semiconductor wafer in dicing of the semiconductor wafer, the protective film forming agent including: a water-soluble resin (A), a light-absorbing agent (B), a basic compound (C), and a solvent (S).

A second aspect of the present invention relates to a method for producing a semiconductor chip by processing a semiconductor wafer, the method including:

forming a protective film by coating the semiconductor wafer with the protective film forming agent according to the first aspect, and irradiating a predetermined position of one or more layers including the protective film on the semiconductor wafer with a laser beam to expose a surface of the semiconductor wafer, and to form a processed groove with a pattern according to a shape of the semiconductor chip.

Effects of the Invention

According to the present invention, it is possible to provide a protective film forming agent, which is used to form a protective film on the surface of a semiconductor wafer in a method for producing a semiconductor chip from a semiconductor wafer, and which can form a protective film that has excellent laser processability, and has excellent solubility of a light-absorbing agent; and a method for producing a semiconductor chip using the protective film forming agent.

PREFERRED MODE FOR CARRYING OUT THE INVENTION

<<Protective Film Forming Agent>>

Figure 1:
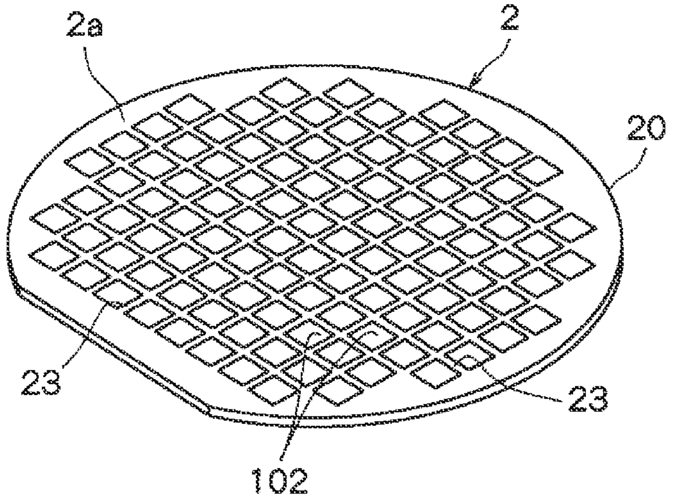
FIG. 1 is a perspective view showing a semiconductor wafer processed by a method of processing a wafer using the protective film forming agent of the present invention.

A protective film forming agent is used to form a protective film on the surface of a semiconductor wafer in dicing of a semiconductor wafer. The protective film forming agent contains a water-soluble resin (A), a light-absorbing agent (B), a basic compound (C), and a solvent (S). Hereinafter, the protective film forming agent is also referred to as "protective film forming agent".

Specifically, the protective film forming agent is suitably used to form a protective film in a method for manufacturing a semiconductor chip including: irradiating a protective film formed on a semiconductor wafer with a laser beam to expose the surface of the semiconductor wafer, and to form a processed groove of a pattern according to the shape of the semiconductor chip; and irradiating the semiconductor wafer including the above protective film and the above processed groove with a laser or plasma to process the position of the processed groove on the semiconductor wafer.

Because the removal of the protective film is easy by water washing after processing the semiconductor wafer, and, when performing plasma irradiation in a method for producing a semiconductor chip described later, the durability of the protective film on plasma irradiation is sufficient, typically the thickness of the protective film is preferably 1 μm or more and 100 μm or less, and more preferably 10 μm or more and 100 μm or less. It is further preferably 30 μm or more and 100 μm or less. In the case of laser irradiation, the thickness of the protective film is preferably 0.1 μm or more and 10 μm or less.

Hereinafter, essential or optional components contained in the protective film forming agent will be explained.

<Water-Soluble Resin (A)>

The water-soluble resin (A) is a base material of a protective film formed using the protective film forming agent. The type of water-soluble resin is not particularly limited so long as being a resin which can be dissolved in a solvent such as water, then coated and dried to form a film. Water-soluble means that 0.5 g or more of solute (water-soluble resin) is dissolved in 100 g of water at 25° C.

The water-soluble resin (A) is preferably a resin which exhibits a weight loss rate of 80% by weight or more in the case of heating up to 500° C. in thermogravimetry. The weight loss rate in the case of heating up to 500° C. is more preferably 90% by weight or more, and further preferably 95% by weight or more. In the case of using a protective film forming agent containing a water-soluble resin (A) for which the weight loss rate when heating up to 500° C. is within the above range, since decomposition of the water-soluble resin (A) by the energy of a laser beam favorably progresses in the protective film, a processed groove favorably opened in the protective film is easily formed by laser beam irradiation.

The weight loss rate of the water-soluble resin (A) when heating up to 350° C. in thermogravimetry is preferably 10% by weight or more, and more preferably 15% by weight or more. In the case of using such a water-soluble resin (A), although the energy amount applied by a laser beam is small, the water-soluble resin (A) tends to favorably decompose, and even in the case of laser irradiation at low output power, a processed groove favorably opened in the protective film is easily formed.

The thermogravimetry for obtaining the weight loss rate can be carried out in accordance with a common thermogravimetry method.

The method for adjusting the weight loss rate of the water-soluble resin (A) is not particularly limited. Generally, when the same type of resin is used, a smaller average molecular weight causes a higher weight loss rate of the water-soluble resin (A).

From the viewpoint of obtaining both the decompose property at the time of laser beam irradiation, and the film forming property, the weight average molecular weight of the water-soluble resin (A) is preferably 15,000 or more and 300,000 or less, and more preferably 20,000 or more and 200,000 or less.

Specific examples of the type of water-soluble resin (A) can include vinyl resin, cellulose resin, polyethylene oxide, polyglycerin, water-soluble nylon, and the like. The vinyl resin is not particularly limited so long as being a homopolymer or copolymer of a monomer having a vinyl group, and being a water-soluble resin. Examples of the vinyl resin include polyvinyl alcohol, polyvinyl acetal (including vinyl acetate copolymers), polyvinylpyrrolidone, polyacrylamide, poly(N-alkyl acrylamide), polyallylamine, poly(N-alkyl allylamine), partially amidated polyallylamine, poly(diallylamine), allylamine-diallylamine copolymer, polyacrylic acid, polyvinyl alcohol polyacrylic acid block copolymer, and polyvinyl alcohol polyacrylic acid ester block copolymer. The cellulose resin is not particularly limited so long as being a water-soluble cellulose derivative. Examples of the cellulose resin include methyl cellulose, ethyl cellulose, hydroxypropyl cellulose, and the like. It is preferred that the water-soluble resin (A) not have an acid group. These can be used individually, or two or more of these can be used in combination.

Among the above specific examples of the water-soluble resin (A), preferred are vinyl resin and cellulose resin, and more preferred are polyvinylpyrrolidone and hydroxypropyl cellulose since shape deterioration, etc. of the processed groove by heat sagging of the protective film hardly occurs.

The protective film formed on the semiconductor wafer surface normally is removed from the surface of the semiconductor wafer or semiconductor chip, at the appropriate moment after formation of the processed groove, according to the method of processing a semiconductor wafer including the protective film and processed groove into semiconductor chips. For this reason, a water-soluble resin having low affinity for the semiconductor wafer surface is preferable from the viewpoint of water washability of the protective film. The water-soluble resin having low affinity for the semiconductor wafer surface is preferably a resin having only an ether bond, hydroxy group, or amide bond as polar groups, for example, polyvinyl alcohol, polyethylene glycol, polyvinylpyrrolidone, and hydroxypropyl cellulose.

Since opening defects upon forming the processed groove by irradiating the protective film with a laser beam, shape deterioration of the processed groove due to heat sagging of the protective film, etc. hardly occur, the ratio of the mass of water-soluble resin (A) relative to the sum of the mass of water-soluble resin (A) and mass of light-absorbing agent (B) in the protective film forming agent is preferably 60% by mass or more and 99% by mass or less, and more preferably 80% by mass or more and 95% by mass or less.

<Light-Absorbing Agent (B)>

As the light-absorbing agent (B), light-absorbing agents generally used for protective film forming agents can be used. As the light-absorbing agent (B), it is preferred to use a water-soluble dye, a water soluble colorant, and a water soluble light-absorbing agent such as a water-soluble ultraviolet absorbing agent. The water-soluble light-absorbing agent exists evenly in the protective film and is thus advantageous. Examples of the water-soluble light-absorbing agent can include organic acids having a carboxy group or a sulfo group; sodium salts, potassium salts, ammonium salts, and quaternary ammonium salts of organic acids; and compounds having a hydroxy group. In the case of using a water-soluble light-absorbing agent, the storage stability of the protective film forming agent is high, and flaws such as phase separation of the protective film forming agent and precipitation of the light-absorbing agent are thus suppressed during storage of the protective film forming agent. Therefore, it is advantageous also from the viewpoint of easily maintaining favorable coatability of the protective film forming agent for a long period.

It should be noted that a water-insoluble light-absorbing agent such as a pigment can also be used. In the case of using a water-insoluble light-absorbing agent, although fatal obstacles to use of the protective film forming agent do not arise, variation in the laser-absorbing ability of the protective film may arise, it may be difficult to obtain a protective film forming agent having excellent storage stability and coatability, and it may be difficult to form a protective film of uniform thickness.

Examples of the light-absorbing agent (B) can include a benzophenone-based compound, a cinnamic acid-based compound, an anthraquinone-based compound, a naphthalene-based compound, and a biphenyl-based compound. Examples of the benzophenone-based compound include a compound represented by the following formula (B1). The compound represented by the following Formula (B1) is preferred because it is capable of efficiently absorbing the energy of a laser beam in the protective film, and promoting the thermal decomposition of the protective film.

[Chem. 1]

(B1)

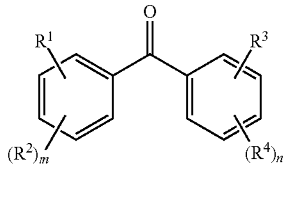

(in Formula (B1), $R^1$ and $R^3$ are each independently a hydroxy group or a carboxy group, $R^2$ and $R^4$ are each independently a hydroxy group, a carboxy group or a group represented by —$NR^5R^6$, $R^5$ and $R^6$ are each independently a hydrogen atom or an alkyl group having 1 or more and 4 or less carbon atoms, and m and n are each independently an integer of 0 or more and 2 or less.)

The compound represented by the above Formula (B1) has a high absorbance index, and exhibits a high absorbance index even in the case of being added to the protective film forming agent together with an alkali. For this reason, when forming a protective film using the protective film forming agent containing a compound represented by the above Formula (B1) as the light-absorbing agent (B), it is possible to favorably perform partial decomposition of the protective film by laser when forming a mask for dicing.

In the above Formula (B1), $R^2$ and $R^4$ may be a group represented by —$NR^5R^6$. $R^5$ and $R^6$ are each independently a hydrogen atom or an alkyl group having 1 or more and 4 or less carbon atoms. The alkyl group as $R^5$ and $R^6$ may be a straight chain or a branched chain. Specific examples of the alkyl group as $R^5$ and $R^6$ include a methyl group, ethyl group, n-propyl group, isopropyl group, n-butyl group, isobutyl group, sec-butyl group and tert-butyl group.

As the group represented by —$NR^5R^6$, an amino group, methylamino group, ethylamino group, dimethylamino group and diethylamino group are preferable, and an amino group, dimethylamino group and diethylamino group are more preferable.

The compound represented by Formula (B1) is preferably a compound represented by the following Formula (B1-1) due to a high absorbance index in the presence of a base:

[Chem. 2]

(B1-1)

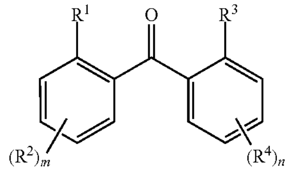

(in Formula (B1-1), $R^1$ to $R^4$, m and n are the same as those in Formula (B1)).

In the above Formula (B1) and Formula (B1-1), at least one of $R^1$ and $R^3$ is preferably a hydroxy group due to a high absorbance index in the presence of a base.

The compound represented by Formula (B1-1) is preferably a compound represented by any of the following Formulas (B1-1a) to (B1-1e):

[Chem. 3]

(B1-1a)

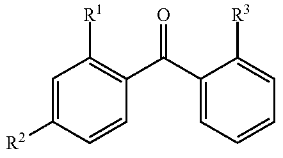

-continued (B1-1b)

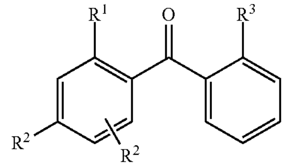

(B1-1c)

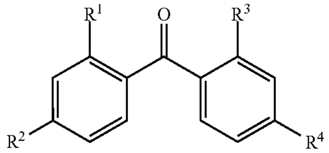

(B1-1d)

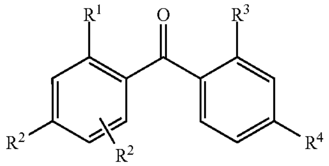

(B1-1e)

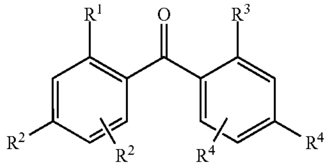

(in Formula (B1-1a) to Formula (B1-1e), $R^1$ to $R^4$ are the same as those in Formula (B1)).

Among the compounds represented by Formula (B1-1a) to Formula (B1-1e), a compound represented by Formula (B1-1a) is preferred. In the compounds represented by Formula (B1-1a) to Formula (B1-1e), preferred are those wherein $R^2$ is the aforementioned group represented by —$NR^5R^6$, and $R^5$ and $R^6$ are each independently an alkyl group having 1 or more and 4 or less carbon atoms.

Suitable specific examples of the compound represented by Formula (B1) include the following compounds. These compounds are preferable due to ease of availability, and a high absorbance index even in the presence of a base.

[Chem. 4]

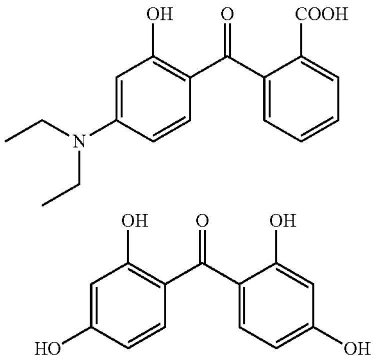

When the light-absorbing agent (B) contains a compound represented by Formula (B1), the proportion of the mass of the compound represented by Formula (B1) relative to the mass of light-absorbing agent (B) is not particularly limited without impairing the object of the present invention. The proportion of the mass of the compound represented by Formula (B1) relative to the mass of light-absorbing agent (B) is preferably 70% by mass or more, more preferably 80% by mass or more, further preferably 95% by mass or more, and particularly preferably 100% by mass.

Examples of the benzophenone-based compound can also include 4,4'-dicarboxybenzophenone, benzophenone-4-carboxylic acid, and tetrahydroxybenzophenone. These are all water soluble ultraviolet absorbing agents.

Examples of the cinnamic acid-based compound include a compound represented by the following Formula (B2). The compound represented by the following Formula (B2) is preferred because it is capable of efficiently absorbing the energy of a laser beam in the protective film, and promoting the thermal decomposition of the protective film.

[Chem. 5]

(B2)

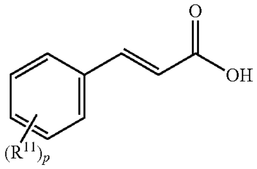

(in Formula (B2), $R^{11}$ is a hydroxy group, an alkoxy group or a group represented by —$NR^{12}R^{13}$, $R^{12}$ and $R^{13}$ are each independently a hydrogen atom or an alkyl group having 1 or more and 4 or less carbon atoms, p is an integer of 0 or more and 3 or less, and when p is 2 or more, a plurality of $R^{11}$s may be the same or different).

In the above Formula (B2), the alkoxy group as $R^{11}$ may be a straight chain or a branched chain. The alkoxy group as RH is preferably an alkoxy group having 1 or more and 4 or less carbon atoms. Specific examples of the alkoxy group as $R^{11}$ is a methoxy group, ethoxy group, n-propoxy group, isopropoxy group, and n-butoxy group.

In the above Formula (B2), $R^{11}$ may be a group represented by —$NR^{12}R^{13}$. $R^{12}$ and $R^{13}$ are each independently a hydrogen atom or an alkyl group having 1 or more and 4 or less carbon atoms. The alkyl group as $R^{12}$ and $R^{13}$ may be a straight chain or a branched chain. Specific examples of the alkyl group as $R^{12}$ and $R^{13}$ include a methyl group, ethyl group, n-propyl group, isopropyl group, n-butyl group, isobutyl group, sec-butyl group and tert-butyl group.

The compound represented by Formula (B2) is preferably a compound represented by the following Formula (B2-1).

[Chem. 6]

(B2-1)

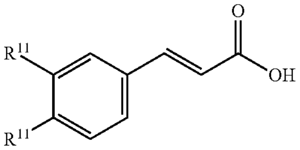

(in Formula (B2-1), $R^{11}$ is the same as $R^{11}$ in Formula (B2)).

Specific examples of the cinnamic acid-based compound can include 4-aminocinnamic acid, 3-aminocinnamic acid, 2-aminocinnamic acid, sinapic acid (3,5-dimethoxy-4-hydroxycinnamic acid), ferulic acid, and caffeine acid. Among these, 4-aminocinnamic acid, 3-aminocinnamic acid, 2-aminocinnamic acid and ferulic acid are preferable, 4-aminocinnamic acid and ferulic acid are more preferable, and 4-aminocinnamic acid is particularly preferable.

Specific examples of the anthraquinone-based compound can include 2-carboxyanthraquinone, 2,6-anthraquinone disulfonic acid, and 2,7-anthraquinone disulfonic acid, and the like.

Specific examples of the naphthalene-based compound can include 1,2-naphthalenedicarboxylic acid, 1,8-naphthalenedicarboxylic acid, 2,3-naphthalenedicarboxylic acid, 2,6-naphthalenedicarboxylic acid, and 2,7-naphthalenedicarboxylic acid, and the like.

Specific examples of the biphenyl-based compound can include biphenyl-4-sulfonic acid, and the like.

Examples of the light-absorbing agent (B) can also include water-soluble amines such as curcumin, and EAB-F (4,4'-bis(diethylamino)benzophenone).

As specific examples of the water-soluble dye, a water-soluble dye is selected from among azo dyes (monoazo and polyazo dyes, metal complex azo dyes, pyrazolone azo dyes, stilbene azo dyes, thiazole azo dyes), anthraquinone dyes (anthraquinone derivatives, anthrone derivatives), indigoid dyes (indigoid derivatives, thioindigoide derivatives), phthalocyanine dyes, carbonium dyes (diphenylmethane dyes, triphenylmethane dyes, xanthene dyes, acridine dyes), quinone imine dyes (azine dyes, oxazine dyes, thiazine dyes), methine dyes (cyanine dyes, azomethine dyes), quinoline dyes, nitroso dyes, benzoquinone and naphthoquinone dyes, naphthalimide dyes, perinone dyes and other dyes.

As the water-soluble colorant, for example, colorants for food additives such as Food Red No. 2, Food Red No. 40, Food Red No. 102, Food Red No. 104, Food Red No. 105, Food Red No. 106, Food Yellow NY, Food Yellow No. 4 tartrazine, Food Yellow No. 5, Food Yellow No. 5 Sunset Yellow FCF, Food Orange AM, Food Vermillion No. 1, Food Vermillion No. 4, Food Vermillion No. 101, Food Blue No. 1, Food Blue No. 2, Food Green No. 3, Food Melon Color B, and Food Egg Color No. 3 are suitable from the viewpoint of low environmental load, etc.

The amount of the light-absorbing agent (B) in the protective film forming agent is not particularly limited without impairing the object of the present invention. The amount of the light-absorbing agent (B) in the protective film forming agent is preferably 0.1% by mass or more and 10% by mass or less. The above protective film forming agent has excellent solubility of the light-absorbing agent (B), and thus the amount of the light-absorbing agent (B) can be increased. Since opening defects upon forming the processed groove by irradiating the protective film with a laser beam, shape deterioration of the processed groove due to heat sagging of the protective film, etc. hardly occur, the ratio of the mass of light-absorbing agent (B) relative to the sum of the mass of water-soluble resin (A) and mass of light-absorbing agent (B) in the protective film forming agent is preferably 1% by mass or more and 50% by mass or less, more preferably 5% by mass or more and 40% by mass or less, and further preferably 10% by mass or more and 40% by mass or less. The amount of the light-absorbing agent (B) can be set so that the absorbance of the protective film formed by coating the protective film forming agent will have a desired value. The absorbance of the protective film formed by coating the protective film forming agent is not particularly limited, and the absorbance of the protective film formed by coating the protective film forming agent is for example preferably 0.3 or more, more preferably 0.8 or more and further preferably 1.0 or more per 1 μm thickness at a wavelength of 355 nm.

<Basic Compound (C)>

The protective film forming agent contains a basic compound (C) as an essential component. By containing the basic compound (C), a protective film that has excellent laser processability can be formed and a protective film forming agent that has excellent solubility of the light-absorbing agent (B) can be obtained. Since the protective film forming agent has excellent solubility of the light-absorbing agent (B), the amount of the light-absorbing agent (B) in the protective film forming agent can be increased. In addition, since the protective film formed has excellent laser processability, desired grooves can be easily formed in the protective film.

As the basic compound (C), both an inorganic compound and an organic compound can be used, and examples thereof include an alkylamine, an alkanolamine, an imidazole compound, ammonia and an alkali metal hydroxide. Specific examples of the basic compound (C) include sodium hydroxide, potassium hydroxide, sodium carbonate, potassium carbonate, sodium silicate, sodium metasilicate and ammonia; ethylamine, n-propylamine, monoethanolamine, diethylamine, di-n-propylamine, diethanolamine, triethylamine, methyldiethylamine, dimethylethanolamine, triethanolamine, tetramethylammonium hydroxide, tetraethylammonium hydroxide, imidazole, 2-methylimidazole, 1,2-methylimidazole, N-methylimidazole, 4-methylimidazole, 2-ethylimidazole, 2-ethyl-4-methylimidazole, pyrrole, piperidine, 1,8-diazabicyclo[5,4,0]-7-undecene, and 1,5-diazabicyclo[4,3,0]-5-nonane. It should be noted that the above basic compound (C) is defined as a component which does not correspond to the solvent (S) in the description.

The amount used of the basic compound (C) is not particularly limited without impairing the object of the present invention. The amount used of the basic compound (C), relative to 1 mol of the light-absorbing agent (B), is preferably 1 mol or more, and more preferably 1 mol or more and 20 mol or less. The lower limit for the amount used of the basic compound (C), relative to 1 mol of the light-absorbing agent (B), may be 1.5 mol or more, may be 2 mol or more, and may be 3 mol or more. The upper limit for the amount used of the basic compound (C), relative to 1 mol of the light-absorbing agent (B), may be 15 mol or less, may be 10 mol or less, and may be 5 mol or less.

<Other Additives>

The protective film forming agent may contain other compounding agents in addition to the water-soluble resin (A), light-absorbing agent (B), and basic compound (C) without impairing the object of the present invention. As the other compounding agents, for example, it is possible to use preservatives, surfactants, etc.

As the preservative, it is possible to use benzoic acid, butylparaben, ethylparaben, methylparaben, propylparaben, benzalkonium chloride, benzethonium chloride, benzyl alcohol, cetylpyridinium chloride, chlorobutanol, phenol, phenylethyl alcohol, 2-phenoxyethanol, phenylmercuric nitrate, thimerosal, metacresol, lauryldimethylamine oxide, or combinations thereof.

Using a preservative is preferable due to not only the preservation from decay of the protective film forming agent, but also a reduction in load in the treatment of waste liquid after semiconductor wafer washing. A large amount of washing water is generally used for washing of semiconductor wafers. However, in the aforementioned process using the protective film forming agent, proliferation of bacteria in the waste liquid is of concern due to the water-soluble resin (A) contained in the protective film forming agent. For this reason, it is desirable to treat the waste liquid derived from the aforementioned process using the protective film forming agent separately from waste liquid derived from a process not using the protective film forming agent. However, in the case of containing a preservative in the protective film forming agent, since the proliferation of bacteria caused by the water-soluble resin (A) is suppressed, the waste liquid derived from the process using the protective film forming agent and the waste liquid derived from the process not using the protective film forming agent can be treated in the same manner. For this reason, it is possible to reduce the load of waste-water treatment step.

The surfactant, for example, is used in order to raise the defoaming property when producing a protective film forming agent, stability of the protective film forming agent, coatability of the protective film forming agent, and the like. In particular, it is preferable to use a surfactant due to the defoaming property when producing a protective film forming agent.

A protective film is generally formed by spin coating the protective film forming agent. However, surface irregularities caused by bubbles may occur upon forming the protective film. In order to suppress the occurrence of such surface irregularities, it is preferable to use an anti-foaming agent such as a surfactant.

As the surfactant, a water-soluble surfactant can be used preferably. As the surfactant, any of nonionic surfactant, cationic surfactant, anionic surfactant and amphoteric surfactant can be used. The surfactant may be silicone based. A nonionic surfactant is preferable due to washability.

<Solvent (S)>

The protective film forming agent contains a solvent (S) for dissolving the water-soluble resin (A), light-absorbing agent (B) and basic compound (C). As the solvent (S), it is possible to use any of water, an organic solvent, and an aqueous solution of organic solvent. Due to little risk of e.g. ignition during use, costs, etc., water and an aqueous solution of organic solvent are preferable as the solvent (S), and water is more preferable.

From the viewpoint of flammability, the amount of the organic solvent in the solvent (S) is preferably 20% by mass or less, more preferably 15% by mass or less, further preferably 10% by mass or less, yet further preferably 5% by mass or less, and particularly preferably 3% by mass or less.

The solvent (S) is preferably selected so that the protective film forming agent does not have a flash point under 1 atm of pressure. Specifically, by adjusting the amount of water in the protective film forming agent, the flash point of the protective film, or the presence/absence of a flash point is adjusted. The protective film forming agent without a flash point is safe and, for example, can be left under a non-explosion proof environment. Specifically, it is possible to carry out handling such as storage, transport and use of the protective film forming agent under a non-explosion proof environment. For example, not only the introduction of the protective film forming agent to the semiconductor factory, but also the formation of the protective film can be carried out under a non-explosion proof environment. Therefore, because an explosion proof environment such as usually expensive explosion proof equipment is unnecessary, the protective film forming agent without a flash point is very advantageous in industry.

The flash point can be measured by the tag closed cup method at a liquid temperature 80° C. or lower, and by the Cleveland open cup method at a liquid temperature exceeding 80° C., under 1 atm of pressure. In the description, a case where the flash point cannot be measured even by the Cleveland open cup method is defined as being without a flash point.

Examples of the organic solvent which can be contained in the protective film forming agent include methyl alcohol, ethyl alcohol, alkylene glycol, alkylene glycol monoalkyl ether, alkylene glycol monoalkyl ether acetate, and the like. Examples of the alkylene glycol include ethylene glycol, propylene glycol, and the like. Examples of the alkylene glycol monoalkyl ether include ethylene glycol monomethyl ether, ethylene glycol monoethyl ether, propylene glycol monomethyl ether, propylene glycol monoethyl ether, and the like. Examples of the alkylene glycol monoalkyl ether acetate include ethylene glycol monomethyl ether acetate, ethylene glycol monoethyl ether acetate, propylene glycol monomethyl ether acetate, propylene glycol monoethyl ether acetate, and the like. The protective film forming agent may contain a combination of two or more types of organic solvent.

The solid content concentration of the protective film forming agent is not particularly limited without impairing the object of the present invention. The solid content concentration, for example, is preferably 5% by mass or more and 60% by mass or less, and more preferably 10% by mass or more and 50% by mass or less.

«Method for Producing Semiconductor Chip»

A method for producing a semiconductor chip is a method including a production of semiconductor chips by processing semiconductor wafers. More specifically, the method for producing a semiconductor chip is a method including: forming a protective film by coating the semiconductor wafer with the aforementioned protective film forming agent; and irradiating a predetermined position of one or more layers including the protective film on the semiconductor wafer with a laser beam to expose the surface of the semiconductor wafer, and to form a processed groove with a pattern according to a shape of the semiconductor chip. Typically, the above production method of semiconductor chips (the method for producing a semiconductor chip) includes a cutting step of cutting the position of streets on the semiconductor wafer. Hereinafter, forming a protective film is also referred to as "protective film forming step", forming a processed groove is also referred to as "processed groove forming step", and cutting the position of a street in the semiconductor wafer is also referred to as "cutting step".

<Protective Film Forming Step>

In the protective film forming step, a protective film is formed by coating the semiconductor wafer with the aforementioned protective film forming agent.

The shape of a processed surface of the semiconductor wafer is not particularly limited so long as the desired processing can be conducted on the semiconductor wafer. Typically, the processed surface of the semiconductor wafer has many surface irregularities. Then, a recessed part is formed in a region corresponding to a street. In the processed surface of the semiconductor wafer, a plurality of regions corresponding to semiconductor chips are demarcated by the streets. Since the protective film is easily removed by water washing after processing, and the protective film has sufficient durability to plasma irradiation in the case of performing plasma irradiation in the cutting step described later, typically, the thickness of the protective film is preferably 1 μm or more and 100 μm or less, and more preferably 10 μm or more and 100 μm or less. It is further preferably 30 μm or more and 100 μm or less. In the case of laser irradiation in the processed groove forming step and/or cutting step, the thickness of the protective film is preferably 0.1 μm or more and 10 μm or less. In the cutting step, in the case of performing cutting by a blade, the thickness of the protective film is not particularly limited. In the case of performing cutting by a blade, since the protective film is easily removed by water washing after processing, the thickness of the protective film is preferably 0.1 μm or more and 100 μm or less, for example.

Hereinafter, about a production method of semiconductor chips, in which using the aforementioned protective film forming agent, dicing processing is performed on a semiconductor wafer including a plurality of semiconductor chips demarcated by a lattice of streets, a preferred aspect of the production method of semiconductor chips will be explained with reference to the drawings.

Figure 2:
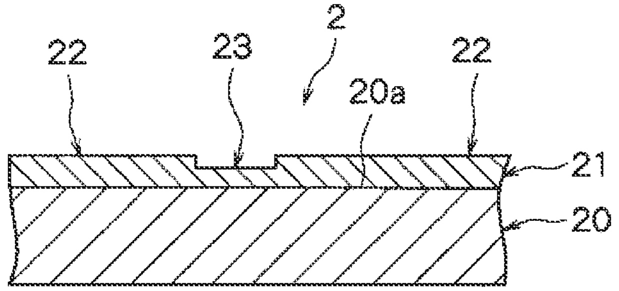
FIG. 2 is an enlarged cross-sectional view of the semiconductor wafer shown in FIG. 1.

FIG. 1 shows a perspective view of a semiconductor wafer as a processing target. FIG. 2 shows an enlarged cross-sectional view of a main part of the semiconductor wafer shown in FIG. 1. In the semiconductor wafer 2 shown in FIGS. 1 and 2, a laminate 21 in which a functional film forming an insulating film and circuit are laminated is provided on the surface 20*a* of a semiconductor substrate 20 such as silicon. In the laminate 21, a plurality of semiconductor chips 22 such as IC and LSI are formed in a matrix shape. Herein, the shape and size of the semiconductor chips 22 are not particularly limited, and can be appropriately set according to the design of the semiconductor chip 22.

Each of the semiconductor chips 22 is demarcated by the streets 23 formed in a lattice shape. It should be noted that, in the illustrated embodiment, the insulating film used as the laminate 21 consists of a $SiO_2$ film, or a low-dielectric constant insulating film (Low-k film) consisting of an inorganic film such as SiOF or BSG (SiOB), or an organic film, which is a polymer film such as of polyimide type or parylene type.

The surface of the above laminate 21 corresponds to the surface 2*a* which is the processed surface. The protective film is formed on the above surface 2*a* using the aforementioned protective film forming agent.

In the protective film forming step, for example, the protective film is formed by coating the protective film forming agent on the surface 2*a* of the semiconductor wafer 2 by a spin coater. It should be noted that the coating method of the protective film forming agent is not particular limited so long as a protective film of a desired thickness can be formed.

Figure 3:
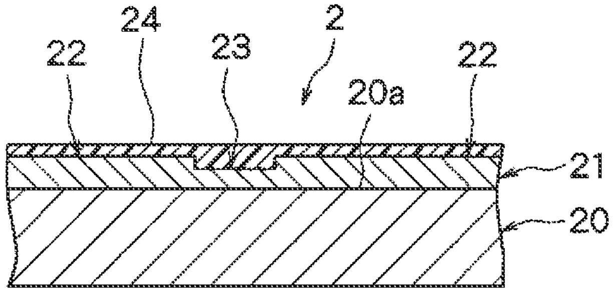
FIG. 3 is an enlarged cross-sectional view of a main part of a semiconductor wafer on which a protective film has been formed.

Next, the protective film forming agent in a liquid form coating the surface 2*a* is dried. A protective film 24 is thereby formed on the surface 2*a* of the semiconductor wafer 2 as shown in FIG. 3.

Figure 4:
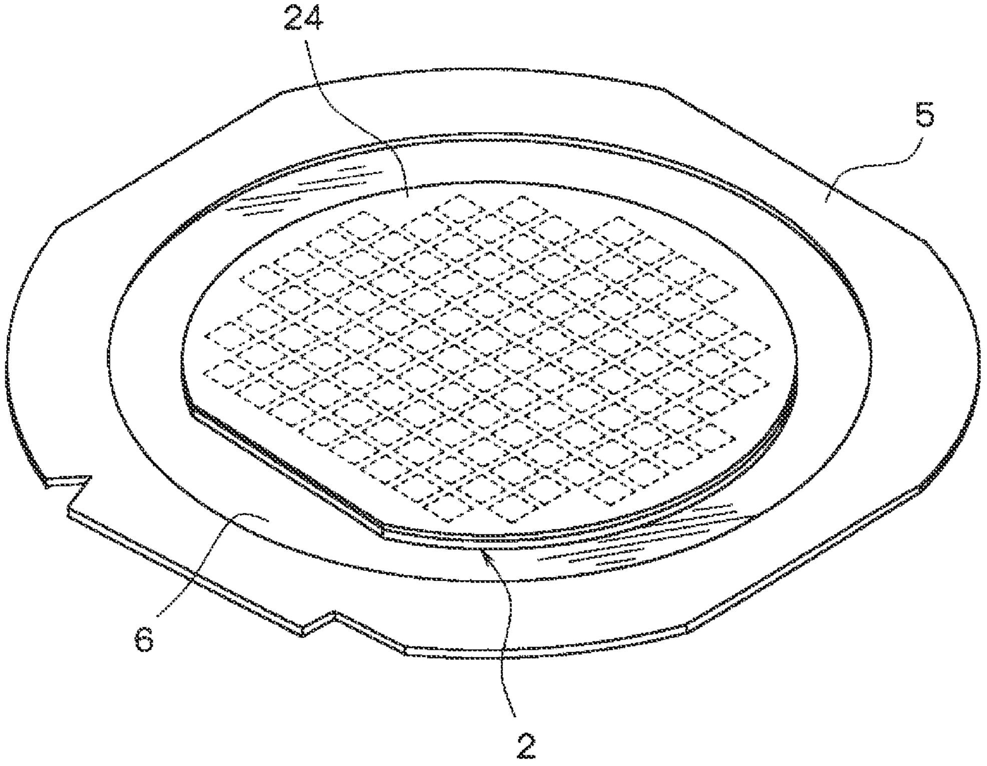
FIG. 4 is a perspective view showing a state in which a semiconductor wafer on which the protective film has been formed is supported by an annular frame via protective tape.

After the protective film 24 is formed on the surface 2*a* of the semiconductor wafer 2 in this way, protective tape 6 put onto an annular frame 5 is pasted on the back surface of the semiconductor wafer 2, as shown in FIG. 4.

<Processed Groove Forming Step>

In the processed groove forming step, a predetermined position of one or more layers including the protective film 24 on the semiconductor wafer 2 is irradiated with a laser beam to expose the surface 20*a* of the semiconductor substrate 20, whereby the processed groove with a pattern according to the shape of the semiconductor chip 22 is formed.

Figure 5:
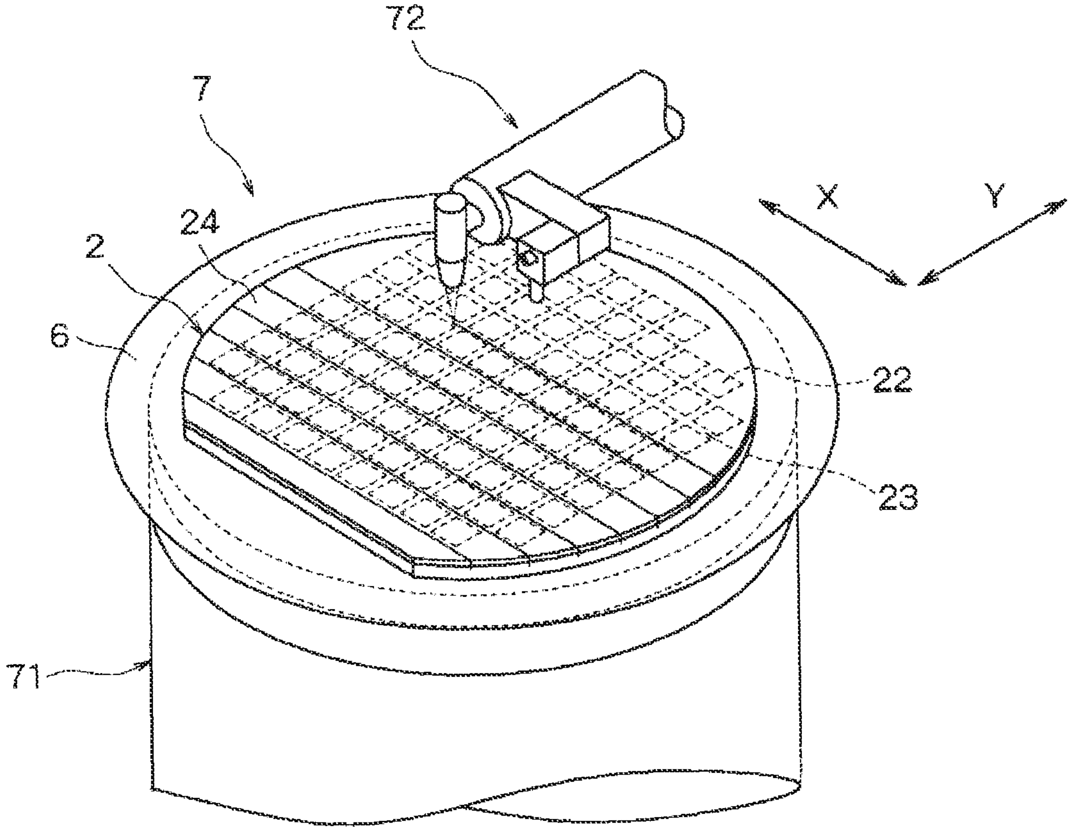
FIG. 5 is a perspective view of a main part of a laser processing device by which a step of laser beam irradiation is conducted.

Specifically, the surface 2*a* (street 23) of the semiconductor wafer 2 is irradiated with a laser beam through the protective film 24 using a laser processing device 7. This laser beam irradiation is carried out using a laser beam irradiation means 72 as shown in FIG. 5. The laser is preferably an ultraviolet laser having a wavelength of 100 nm or more and 400 nm or less because of the intensity. In addition, a YVO4 laser and YAG laser with a wavelength of e.g. 266 nm or 355 nm are preferable.

The above laser beam irradiation in the processed groove forming step is performed on the following processing conditions, for example. It should be noted that the light collecting spot diameter is appropriately selected considering the width of the processed groove 25.

Light source of laser beam: YVO4 laser or YAG laser,
Wavelength: 355 nm,
Repetition frequency: 50 kHz or more and 100 kHz or less,
Output: 0.3 W or more and 4.0 W or less,
Process feed rate: 1 mm/s or more and 800 mm/s or less.

Figure 6:
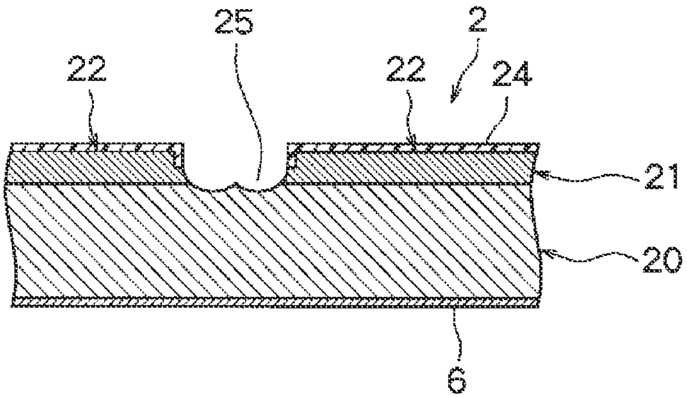
FIG. 6 is an enlarged cross-sectional view of a semiconductor wafer including a protective film and a processed groove formed by laser beam irradiation.

By carrying out the aforementioned processed groove forming step, the processed groove 25 is formed along the street 23 in the laminate 21 including the street 23 of the semiconductor wafer 2, as shown in FIG. 6. In the case where the protective film 24 is formed from the aforementioned protective film forming agent, since laser processability is excellent, i.e. properties of decomposition and removal by lasers are excellent, it is possible to easily form in the protective film 24 a groove having a desired shape by irradiating the protective film 24 with a laser beam as described above.

Laser beam irradiation along predetermined streets 23 is carried out as described above, and the semiconductor wafer 2 retained on a chuck table 71 is then indexed by intervals of the streets in the direction indicated by the arrow Y, and laser beam irradiation is carried out again.

After laser beam irradiation and indexing along all the streets 23 extending in a predetermined direction as described above, the semiconductor wafer 2 retained on the chuck table 71 is rotated by 90 degrees, and the laser beam irradiation and indexing are carried out in the same manner as above along each street 23 extending at a right angle relative to the above predetermined direction. In this way, it is possible to form the processed grooves 25 along all the streets 23 formed in the laminate 21 on the semiconductor wafer 2.

<Cutting Step>

In the cutting step, the semiconductor wafer 2 including the processed groove 25 at a position corresponding to the position of the street 23 is cut. Examples of preferred methods include a method of cutting the semiconductor wafer 2 by irradiating the semiconductor wafer 2 including the protective film 24 and processed groove 25 with a laser or plasma, and a method of cutting the semiconductor wafer 2 including the protective film 24 or semiconductor wafer 2 from which the protective film 24 has been peeled, by a blade. In the case of laser irradiation, the processed groove 25 is irradiated with the laser in order to cut the semiconductor wafer 2. In the case of plasma irradiation, part of the surface including the protective film of the semiconductor wafer 2 or the entire surface is irradiated with plasma so that the surface of the processed groove 25 is exposed to plasma. In the case of cutting by a blade, the semiconductor wafer 2 is cut by a blade along the position of the processed groove 25, while supplying pure water to the cutting location. Hereinafter, a cutting method by plasma irradiation which is a preferable cutting method will be explained.

Figure 7:
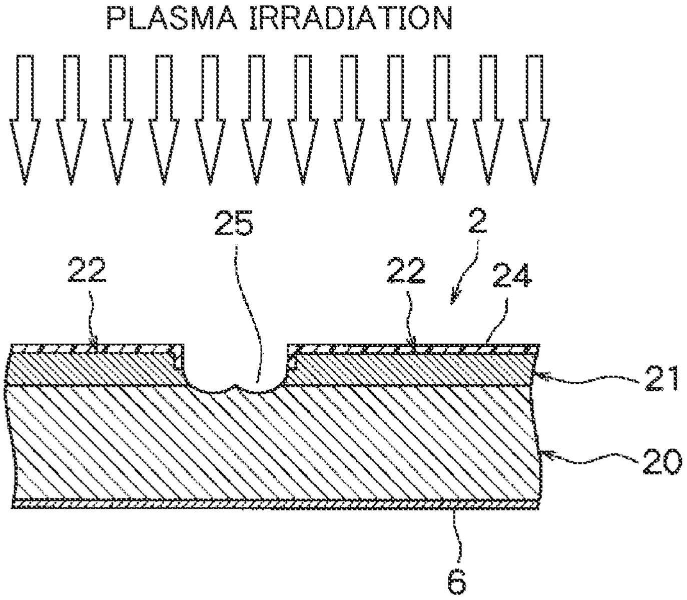
FIG. 7 is an explanatory view showing plasma irradiation on the semiconductor wafer shown in FIG. 6.
Figure 8:
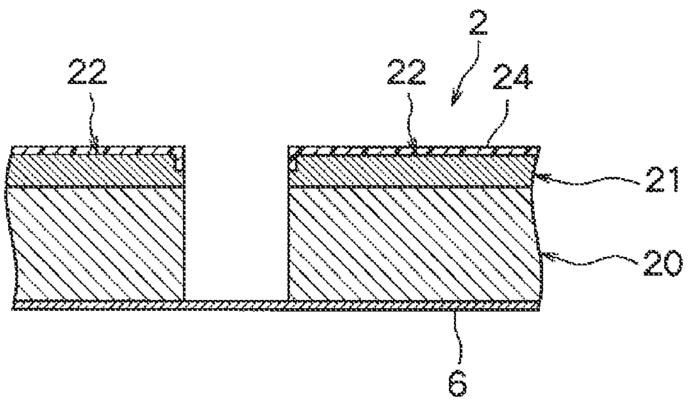
FIG. 8 is an enlarged cross-sectional view showing a state in which a semiconductor wafer is divided into semiconductor chips by plasma irradiation.

As shown in FIG. 7, the semiconductor wafer 2 including the protective film 24 and processed groove 25 is irradiated with plasma. By doing this, the position of the processed groove 25 in the semiconductor wafer 2 is cut as shown in FIG. 8. Specifically, in the semiconductor wafer 2 coated by the protective film 24, after forming the processed groove 25 as described above, the semiconductor wafer 2 is cut according to the shape of the semiconductor chips 22 by irradiating the protective film 24 and the surface 20*a* of the semiconductor substrate 20 exposed from the processed groove 25 with plasma to divide the semiconductor wafer 2 into the semiconductor chips 22.

The plasma irradiation conditions are not particularly limited so long as the semiconductor wafer 2 can be favorably cut at the position of the processed groove 25. The plasma irradiation conditions are appropriately set within a range of common conditions of plasma etching on a semiconductor substrate, considering e.g. the material of the semiconductor wafer 2, and plasma type. The gas used to generate plasma in the plasma irradiation is appropriately selected according to the material of the semiconductor wafer 2. Typically, $SF_6$ gas is used to generate plasma. In addition, by alternately performing sidewall protection by the supply of e.g. $C_4F_6$ or $C_4F_8$ gas, and etching of the semiconductor wafer 2 by plasma irradiation in accordance with the so-called BOSCH process, the semiconductor wafer 2 may be cut. According to the BOSCH process, etching with a high-aspect ratio is possible, and even in a case of the semiconductor wafer 2 being thick, the semiconductor wafer 2 is easily cut.

Figure 9:
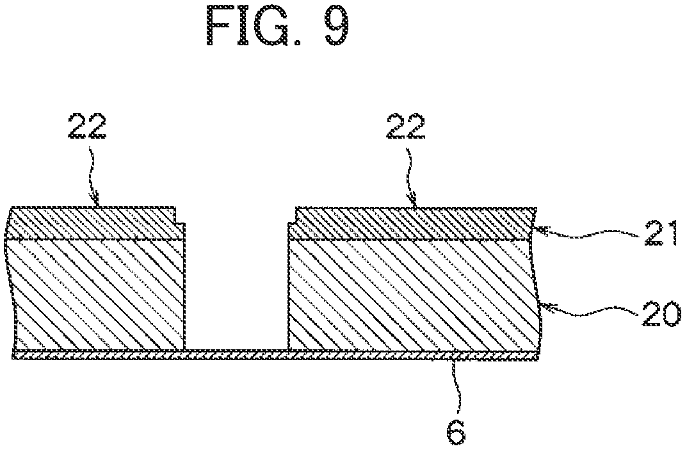
FIG. 9 is an enlarged cross-sectional view showing a state in which a protective film on a semiconductor chip has been removed.

Next, as shown in FIG. 9, the protective film 24 covering the surface of the semiconductor chip 22 is removed. As mentioned above, the protective film 24 is formed using the protective film forming agent containing the water-soluble resin (A); therefore, it is possible to wash away the protective film 24 using water (or hot water).

The production method of semiconductor chips by processing a semiconductor wafer has been explained above based on the embodiment as described above. The protective film forming agent and production method of semiconductor chips according to the present invention can be applied to production methods of various semiconductor chips so long as being a method including forming a protective film on the semiconductor wafer surface, and forming a processed groove at a position corresponding to a street in the surface including the protective film of the semiconductor wafer.

EXAMPLES

The present invention will now be explained in detail by way of Examples and Comparative Examples thereof. The present invention is not limited to the following examples in any way.

Examples 1 to 15, and Comparative Examples 1 to 12

In Examples 1 to 15 and Comparative Examples 1 to 12, hydroxypropyl cellulose (A1) or polyvinylpyrrolidone (A2) was used as the water-soluble resin (A). In addition, B1 to B4 represented by the following Formulas were used as the light-absorbing agent (B).

[Chem. 7]

B1

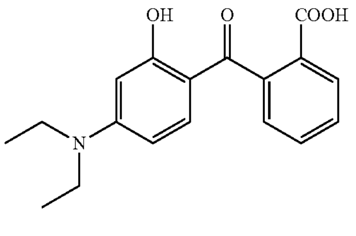

-continued

B2

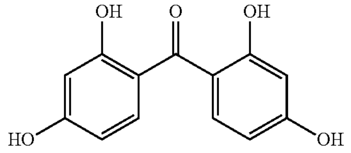

B3

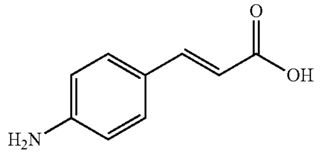

B4

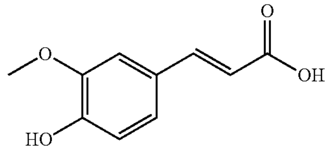

In addition, monoethanolamine (C1), diethanolamine (C2), triethanolamine (C3), imidazole (C4), ammonia (C5), or NaOH (C6) was used as the basic compound (C). In addition, water (S1), or propylene glycol monomethyl ether (PGME) (S2) was used as the solvent (S).

(Production of Protective Film Forming Agent)

A water-soluble resin (A), a light-absorbing agent (B), a basic compound (C), and a solvent (S) with a type and amount described in Tables 1 to 3 were added to a container, and the obtained mixture was stirred for 8 hours to obtain a protective film forming agent in each Example and Comparative Example. It should be noted that the unit of composition values (amounts) in Tables 1 to 3 is % by mass.

(Evaluation of Solubility of Light-absorbing Agent)

The obtained protective film forming agents were visually observed, and evaluated in accordance with evaluation criteria described below. The results are described in Tables 1 to 3.

<Evaluation Criteria of Solubility of Light-absorbing Agent> o: there was not undissolved light-absorbing agent, and x: there was undissolved light-absorbing agent.

(Measurement of Absorbance of Protective Film (Coated Film))

Using the obtained protective film forming agent, a protective film was formed on a glass substrate by a spin coating method (spin coating conditions: 2000 rpm, 120 seconds). On the formed protective films, transmissivity was measured using a spectrophotometer (MCPD-300 (manufactured by Otsuka Electronics Co., Ltd.)), and the absorbance per 1 μm thickness at a wavelength of 355 nm was measured from the measurement results of the transmissivity. The measurement results are noted in Tables 1 to 3. It should be noted that the absorbance of protective film forming agents, in which undissolved light-absorbing agent was observed, was not measured.

(Evaluation of Laser processability)

The obtained protective film forming agent was coated on a silicon substrate by a spin coating method so that the film thickness was 2 μm to form a protective film. The surface on the protective film side of the silicon substrate including the protective film was irradiated linearly with a laser in the following conditions. After that, the protective film was removed, and a site irradiated with a laser (processed part) and the vicinity thereof were observed with an optical microscope, and evaluated in accordance with evaluation criteria described below. In the case of bad laser processability, since it is difficult to decompose and remove the protective film, the protective film is not decomposed and removed, and is peeled from the substrate in the state of the film, and debris of the substrate adheres to the peeled part. Therefore, laser processability can be evaluated by observing the processed part and the vicinity thereof after removing the protective film.

<Laser Irradiation Conditions>

Wavelength: 355 nm,

Frequency: 100 kHz,

Output: 0.8 W,

Defocus: −0.0 mm,

Feed rate: 100 mm/s,

Pass: 1.

<Evaluation Criteria of Cross-sectional Shape> o: adhesion of debris to the outside of the processed part was not observed, and x: adhesion of debris to the outside of the processed part was observed.

TABLE 1

| | | | Example | | | | | Comparative Example | | | | |
|---|---|---|---|---|---|---|---|---|---|---|---|---|
| | | | 1 | 2 | 3 | 4 | 5 | 1 | 2 | 3 | 4 | 5 |
| Composition | Water-soluble resin (A) | A1 | 9 | 9 | 9 | 9 | — | 9 | 9 | 9 | 9 | 9.9 |
| | | A2 | — | — | — | — | 9 | — | — | — | — | — |
| | Light-absorbing agent (B) | B1 | 1 | — | — | — | 1 | 1 | — | — | — | — |
| | | B2 | — | 1 | — | — | — | — | 1 | — | — | — |
| | | B3 | — | — | 1 | — | — | — | — | 1 | — | — |
| | | B4 | — | — | — | 1 | — | — | — | | 1 | 0.1 |
| | Basic compound (C) | C1 | 0.39 | 0.50 | 0.75 | 0.63 | 0.39 | — | — | — | — | — |
| | Solvent (S) | S1 | 89.61 | 89.50 | 89.25 | 89.37 | 89.61 | 90 | 90 | 90 | 90 | 90 |
| | Evaluation | Solubility | ○ | ○ | ○ | ○ | ○ | x | x | x | x | ○ |
| | | Absorbance | 1.3 | 0.8 | 1.5 | 0.4 | 1.3 | — | — | — | — | 0.04 |
| | | Laser processability | ○ | ○ | ○ | ○ | ○ | — | — | — | — | x |

TABLE 2

| | | | Example | | | | | |
|---|---|---|---|---|---|---|---|---|
| | | | 6 | 7 | 8 | 9 | 10 | 11 |
| Composition | Water-soluble resin (A) | A1 | 9 | 9 | 9 | 9 | 9 | 9 |
| | Light-absorbing agent (B) | B1 | 1 | 1 | 1 | 1 | 1 | 1 |
| | Basic compound (C) | C1 | — | — | — | — | — | 0.205 |
| | | C2 | 0.67 | — | — | — | — | — |
| | | C3 | — | 1.90 | — | — | — | — |
| | | C4 | — | — | 0.43 | — | — | — |
| | | C5 | — | — | — | 0.11 | — | — |
| | | C6 | — | — | — | — | 0.26 | — |
| | Solvent (S) | S1 | 89.33 | 88.10 | 89.57 | 89.89 | 89.74 | 89.795 |
| | Evaluation | Solubility | ○ | ○ | ○ | ○ | ○ | ○ |
| | | Absorbance | 1.3 | 1.3 | 1.3 | 1.3 | 1.3 | 1.3 |
| | | Laser processability | ○ | ○ | ○ | ○ | ○ | ○ |

TABLE 3

| | | | Example | | | | Comparative Example | | | | | | |
|---|---|---|---|---|---|---|---|---|---|---|---|---|---|
| | | | 12 | 13 | 14 | 15 | 6 | 7 | 8 | 9 | 10 | 11 | 12 |
| Composition | Water-soluble resin (A) | A1 | 9.7 | 9.5 | 9.75 | 9 | 9.7 | 9.5 | 9.75 | 9 | — | — | — |
| | | A2 | — | — | — | — | — | — | — | — | 9.7 | 9.5 | 9.75 |
| | Light-absorbing agent (B) | B1 | 0.3 | — | — | — | 0.3 | — | — | — | 0.3 | — | — |
| | | B2 | — | 0.5 | — | — | — | 0.5 | — | — | — | 0.5 | — |
| | | B3 | — | — | 0.25 | — | — | — | 0.25 | — | — | — | 0.25 |
| | | B4 | — | — | — | 1 | — | — | — | 1 | — | — | — |
| | Basic compound (C) | C1 | 0.11 | 0.25 | 0.19 | 0.63 | — | — | — | — | — | — | — |

TABLE 3-continued

| | | Example | | | | Comparative Example | | | | | | |
|---|---|---|---|---|---|---|---|---|---|---|---|---|
| | | 12 | 13 | 14 | 15 | 6 | 7 | 8 | 9 | 10 | 11 | 12 |
| Solvent (S) | S1 | 18 | 18 | 18 | 18 | 18 | 18 | 18 | 18 | 18 | 18 | 18 |
| | S2 | 71.89 | 71.75 | 71.81 | 71.37 | 72 | 72 | 72 | 72 | 72 | 72 | 72 |
| Evaluation | Solubility | ○ | ○ | ○ | ○ | x | x | x | x | x | x | x |
| | Absorbance | 0.4 | 0.4 | 0.4 | 0.4 | — | — | — | — | — | — | — |
| | Laser processability | ○ | ○ | ○ | ○ | — | — | — | — | — | — | — |

From Tables 1 to 3, it is found that the protective film forming agents in Examples 1 to 14, containing a water-soluble resin (A), light-absorbing agent (B), basic compound (C), and solvent (S), have excellent solubility of the light-absorbing agent. It is also found that the protective films formed using the protective film forming agents in Examples 1 to 14 have high absorbance and excellent laser processability. On the other hand, from Tables 1 to 3, it is found that the protective film forming agents in Comparative Examples 1 to 12, not containing a basic compound (C), have poor solubility of the light-absorbing agent and laser processability of protective films.

EXPLANATION OF REFERENCE NUMERALS

2 Semiconductor wafer
20 Substrate
21 Laminate
22 Semiconductor chip
23 Street
24 Protective film
25 Laser processed groove
26 Cut groove
3 Spin coater
5 Annular frame
6 Protective tape
7 Laser processing device
71 Chuck table of laser processing device
72 Laser beam irradiation means

The invention claimed is:

1. A protective film forming agent for forming a protective film on a surface of a semiconductor wafer in dicing of the semiconductor wafer, the protective film forming agent comprising:

a water-soluble resin (A), a light-absorbing agent (B), a basic compound (C), and a solvent(S), wherein a content of the basic compound (C) is 0.11% by mass or more and 0.43% by mass or less, the water-soluble resin (A) comprises polyvinylpyrrolidone or hydroxypropyl cellulose, the light-absorbing agent (B) is a compound represented by formula (B1) or formula (B2), (B1)

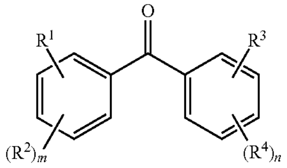

wherein in formula (B1), $R^1$ and $R^3$ are each independently a hydroxy group or a carboxy group, $R^2$ and $R^4$ are each independently a hydroxy group or a group represented by $—NR^5R^6$, $R^5$ and $R^6$ are each independently a hydrogen atom or an alkyl group having 1 or more and 4 or less carbon atoms, and m and n are each independently an integer of 0 or more and 2 or less, (B2)

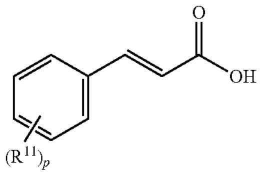

wherein in formula (B2), $R^{11}$ is a group represented by $—NR^{12}R^{13}$, $R^{12}$ and $R^{13}$ are each independently a hydrogen atom or an alkyl group having 1 or more and 4 or less carbon atoms, p is an integer of 0 or more and 3 or less, and when p is 2 or more, a plurality of $R^{11}$s may be the same or different, wherein the basic compound (C) comprises one selected from the group consisting of monoethanolamine, diethanolamine, imidazole, ammonia, and NaOH.

2. The protective film forming agent according to claim 1, wherein an amount of the light-absorbing agent (B) is 0.1% by mass or more and 10% by mass or less.

3. The protective film forming agent according to claim 1, wherein the solvent(S) comprises water.

4. The protective film forming agent according to claim 1, wherein an amount of an organic solvent in the solvent(S) is 20% by mass or less.

5. A method for producing a semiconductor chip by processing a semiconductor wafer, the method comprising:

forming a protective film by coating the semiconductor wafer with the protective film forming agent according to claim 1; and irradiating a predetermined position of one or more layers comprising the protective film on the semiconductor wafer with a laser beam to expose a surface of the semiconductor wafer, and to form a processed groove with a pattern according to a shape of the semiconductor chip.

* * * * *